United States Patent [19]

Motoike

[11] Patent Number: 5,294,844
[45] Date of Patent: Mar. 15, 1994

[54] SAMPLING SIGNAL GENERATION CIRCUIT

[75] Inventor: Koichi Motoike, Yokohama, Japan

[73] Assignee: Kabushiki Kaisha Toshiba, Kawasaki, Japan

[21] Appl. No.: 854,538

[22] Filed: Mar. 19, 1992

[30] Foreign Application Priority Data

Mar. 27, 1991 [JP] Japan .................. 3-063452

[51] Int. Cl.⁵ .................. H03K 5/13; H03K 5/135; H03K 5/153
[52] U.S. Cl. .................. 307/352; 307/269; 307/354; 328/63; 328/150
[58] Field of Search .................. 307/352, 354, 269; 328/63, 150, 151

[56] References Cited

U.S. PATENT DOCUMENTS

| | | | |
|---|---|---|---|
| 4,675,612 | 6/1987 | Adams et al. | 328/63 |
| 4,713,621 | 12/1987 | Nakamura et al. | 328/63 |
| 5,022,057 | 6/1991 | Nishi et al. | 328/63 |
| 5,087,828 | 2/1992 | Sato et al. | 307/269 |

Primary Examiner—John Zazworsky
Attorney, Agent, or Firm—Foley & Lardner

[57] ABSTRACT

In a sampling signal generation circuit, means for producing a plurality of clock signals from a reference clock signal is provided. The transition points of these clock signals are compared with those of a signal to be sampled. As the result of this comparison, the most suitable clock signal is selected to be a sampling signal, in order to carry out a sampling of the signal.

9 Claims, 5 Drawing Sheets

SAMPLING SIGNAL GENERATION CIRCUIT

BACKGROUND OF THE INVENTION

1. Field of the invention

This invention relates to a sampling signal generation circuit in which the most suitable signal can be generated so as to carry out a correct sampling of an input signal.

2. Description of the prior arts

In a circuit for sampling digital signals, e.g., data signals, according to a synchronizing signal, e.g., a clock signal, these digital signals should be input in a stable and effective state. The circuit includes a sampling circuit for separately sampling output signals from a flip-flop circuit. In order to realize said stable sampling, clock signals should not be given when signals to be sampled are in an unstable state or in a transition state.

In the past, to realize said stable sampling, the length of signal lines, in which sampling signals and clock signals are traveling, were so adjusted that timings between both signals become appropriate. In other words, the traveling speeds of signals to be sampled and clock signals were adjusted by changing their signal line lengths. In this case, however, the signal line lengths should be decided precisely by correctly calculating the traveling delays of signals in the circuit, so as to obtain an appropriate timing between both signals. This means that an enormous effort was required to design circuits correctly. Furthermore, as traveling speeds of signals become faster, flexible period of timings between both signals becomes shorter. The signal line lengths should, therefore, be decided more precisely, thus making it a difficult to design such circuits.

Once the circuit, which is designed as mentioned above, is fabricated as an integrated circuit product, errors arise between real circuit values of the product and designed values, due to various reasons which are caused within fabrication processes. If these errors are above the tolerance, an additional adjustment, such as to form a signal line using a concentric cable outside a chip, is required to correct the errors. Because of this adjustment, however, the integration of the circuit become difficult, thus causing difficulty in reducing the size of a product.

In addition to the disadvantages mentioned above, the prior art circuit has another disadvantage. That is, when the phase of a sampling signal, which is synchronous with a clock signal, varies during the operation, there is no way to correct the timing of both signals to avoid an erroneous operation. In other words, the prior art circuit cannot carry out real time processing for the phase variations of a sampling signal and a signal to be sampled. As a result, the reliability of the prior art circuit is degraded.

SUMMARY OF THE INVENTION

This invention has been made to overcome the above mentioned problems of the prior art circuit.

Therefore, one objective of this invention is to provide a sampling signal generation circuit in which the most suitable sampling signal can be generated without adding an external timing correction means.

Another objective of this invention is to provide a sampling signal generation circuit which can be highly integrated so as to obtain a small size product.

The other objective of this invention is to provide a sampling signal generation circuit which is able to cope with the phase variations of a sampling signal and a signal to be sampled in a real time, and thereby improving its reliability.

The sampling signal generation circuit according to this invention is characterized by the fact that a plurality of clock signals, each of which has a different phase relationship against a reference clock signal, are generated. Each transition point of these clock signals are, then, compared with the transition points of a signal to be sampled. According to this comparison, the most suitable clock signal is selected and output as a sampling signal.

According to the above mentioned characteristics of this invention, the most suitable clock signal is selected to be sampling signal in a real time processing. Thus, even if the phase of a reference clock signal or a signal to be sampled varies during the operation, the circuit of this invention is able to cope with this variation without delay. As a result, the sampling reliability of this circuit can be greatly improved. Also, the selection of clock signals is carried out within the circuit, thus enabling high integration of this circuit.

These and other objectives, features, and advantages of the present invention will be more apparent from the following description of preferred embodiments, taken in conjunction with the accompanying drawings.

DETAILED DESCRIPTION OF PREFERRED EMBODIMENTS

Figure 1:
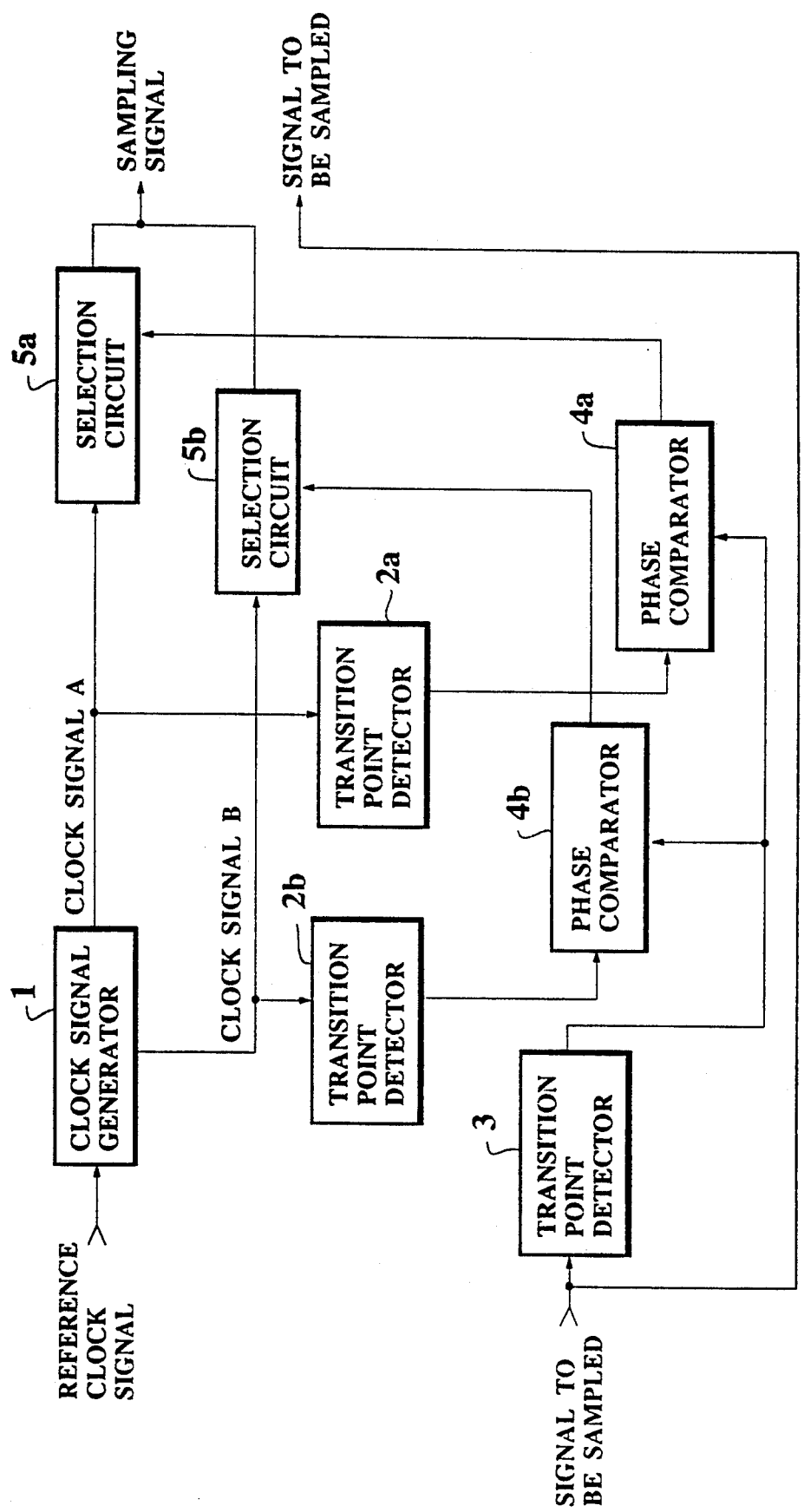
FIG. 1 is a block diagram showing the sampling signal generation circuit according to one embodiment of this invention.

FIG. 1 is a block diagram showing the basic structure of the sampling signal generation circuit according to one embodiment of this invention. In the circuit shown in FIG. 1, two kind of clock signals, each of which has a different phase, are generated from a reference clock signal. One of said two clock signals, which is more suitable for the signal to be sampled, is chosen to be a sampling signal.

As shown in FIG. 1, the circuit is comprised of the following: a clock signal generator 1; transition point detectors 2a, 2b, and 3; phase comparators 4a and 4b; and selection circuits 5a and 5b.

Once said generator 1 has received a reference clock signal whose frequency is set according to the traveling speed of a signal to be sampled, e.g., data signal, this clock signal is delayed in order to generate two kind of clock signals A and B. These two clock signals are, then, given to the respective detectors 2a or 2b. In each detector 2a and 2b, the transition points of clock signals A and B are detected respectively. In other words, detectors 2a and 2b detect the leading and trailing edges of signals A and B respectively. Then, these detectors output signals, each of which has a phase corresponding to the detected edges.

On the other hand, transition point detector 3 receives an input signal to be sampled, and then, detects its transition points. That is, detector 3 finds the variation points of binary informations which are carried by means of the input signal to be sampled. Then, detector 3 outputs a signal corresponding to said transition points. This signal is, then, introduced into phase comparators 4a and 4b respectively.

In each phase comparator 4a and 4b, the signal, which is obtained from detector 3 and shows the transition points of the input signal to be sampled, is compared with the respective signal, which is obtained from detector 2a or 2b and indicates the transition points of clock signal A or B. As the result of this comparison, each comparator outputs a signal showing the phase difference between respective clock signal and the input signal to be sampled. The compared signals are then introduced into corresponding selection circuits 5a and 5b.

Selection circuits 5a and 5b decide whether to select or not to select clock signals A and B according to the signals obtained from phase comparators 4a and 4b. In other words, selection circuits 5a and 5b select one of clock signals A and B, and output the selected signal A or B to be a synchronizing signal for sampling the input signal.

Figure 2:
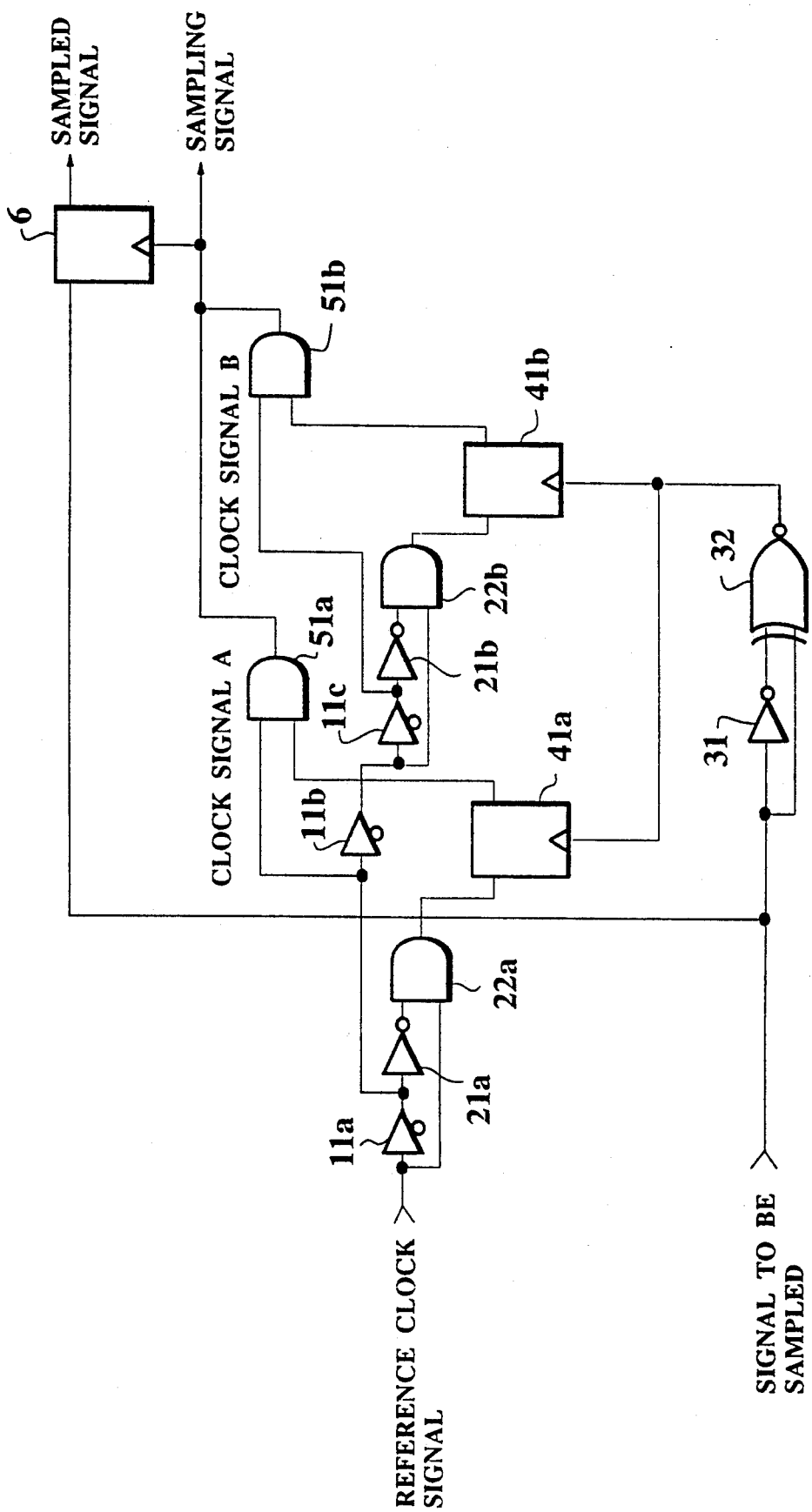
FIG. 2 is a schematic diagram showing the sampling signal generation circuit according to another embodiment of this invention.

FIG. 2 is a circuit diagram embodying the sampling signal generation circuit shown in FIG. 1. As shown in this figure, each circuit element shown in FIG. 1 can be realized with logic gates and flip-flop (F/F) circuits.

In FIG. 2, clock signal generator 1 shown in FIG. 1 is comprised of buffer gates 11a, 11b, and 11c. Buffer gate 11a receives the reference clock signal, and delays it by the internal delay time (Tpd) of this buffer 11a. As a result, buffer 11a generates clock signal A whose phase is delayed by against the phase of the reference clock signal. Buffer gate 11c receives the output from buffer gate 11a through buffer gate 11b and generates clock signal B. The phase of this clock signal B is, thus, delayed by the total amount of internal delay times of buffer gates 11a to 11c. At the generation of clock signals A and B, delays which are caused by wiring lines can also be calculated to derive the total delay time.

Transition point detector 2a shown in FIG. 1 is comprised of an inverter gate 21a and an AND gate 22a. Clock signal A is inverted by inverter gate 21a and input to AND gate 22a. In this gate 22a, the logical product between said inverted signal and the reference clock signal is obtained so as to find the leading edge of clock signal A. As a result, a signal, which is synchronized to the leading edge of clock A, is obtained from the output of gate 22a.

Transition point detector 2b shown in FIG. 1 is comprised of an inverter gate 22b and an AND gate 21b. Clock signal B is inverted by this inverter gate 21b and input to AND gate 22b. In this gate 22b, the logical product between said inverted signal and the output signal from buffer gate 11b is obtained so as to find the leading edge of clock signal B. As a result, a signal, which is synchronized to the leading edge of clock B, is obtained from the output of gate 22b.

Transition point detector 3 shown in FIG. 1 is comprised of an inverter gate 31 and an EX-NOR gate 32. The input signal to be sampled is inverted by inverter gate 31 and input to EX-NOR gate 32. In this gate 32, an EX-NOR operation is carried out between said input signal and its inverted signal so as to find the leading and trailing edges of this input signal. As a result, a signal, which is synchronized to the leading and trailing edges of the input signal, is obtained from EX-NOR gate 32.

Each phase comparator 4a and 4b shown in FIG. 1 is comprised of a flip-flop (F/F) circuit 41a and 41b respectively. In F/F circuit 41a, the output from gate 22a is sampled using the output from EX-NOR gate 32 as a synchronizing signal. As the result of this sampling, the transition point of the input signal to be sampled is compared with the transition point of clock signal A. In other words, a compared signal which shows the phase relation between the input signal and clock signal A, is obtained from the output of F/F circuit 41a. In the same way, a compared signal, which shows the phase relation between the input signal and clock signal B, is obtained from the output of F/F circuit 41b.

Selection circuits 5a and 5b are comprised of AND gates 51a and 51b respectively. These AND gates 51a and 51b output corresponding clock signal A or B to be a sampling signal when the compared signals given by F/F circuits 41a and 41b are at a high level.

In the circuit shown in FIG. 2, each logic gate is assumed to have the same internal delay time (Tpd) and to generate the same delay time Tpd between input and output signals.

The operation of the circuit shown in FIG. 2 will be explained next by referring to the timing chart shown in FIG. 3.

Figure 3:
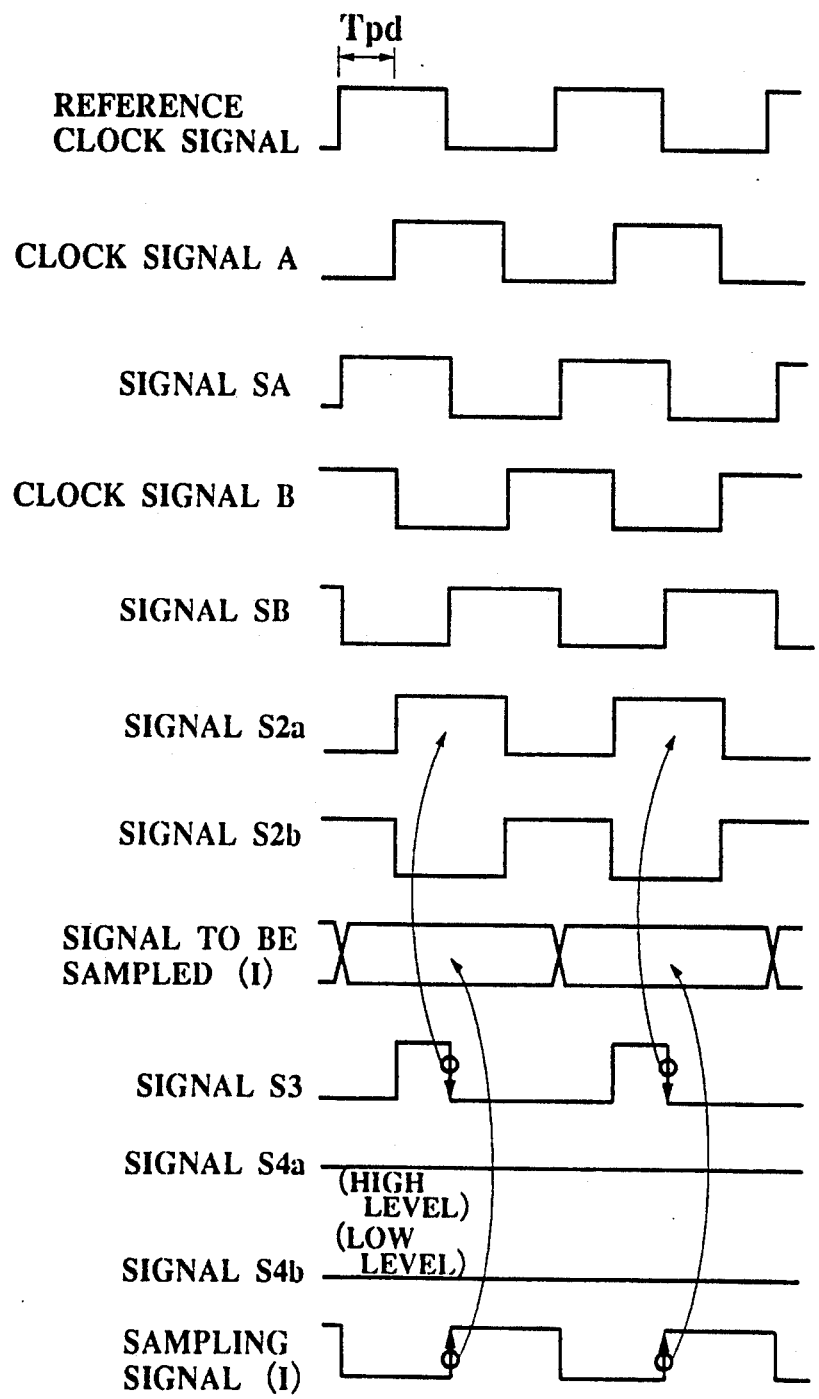
FIG. 3 is a timing chart used to explain the operation of circuits shown in FIGS. 1 and 2.

First, a reference clock signal shown in FIG. 3 is introduced into buffer gate 11a. Then, clock signal A, whose phase is delayed by the internal delay time of buffer 11a, is generated from the output of buffer 11a. This clock signal A is, then, inverted and delayed by inverter gate 21a so as to obtain signal SA. At AND gate 22a, the logical product between said signal SA and the reference clock signal is obtained. As a result, signal S2a, which is synchronous to the leading edge of clock signal A, is obtained as shown in FIG. 3 from the output of AND gate 22a.

On the other hand, clock signal A which is output from buffer gate 11a, is given to buffer gate 11c through buffer gate 11b. As a result, clock signal B, which is delayed by the internal delay times of buffers 11b and 11c, is generated from buffer gate 11c. This clock signal B is, then, inverted and delayed by inverter gate 21b to form signal SB. In AND gate 22b, the logical product between signal SB and the output signal from buffer gate 11b is derived to generate signal S2b, which is synchronous to the leading edge of clock signal B, as shown in FIG. 3.

The input signal (I), which should be sampled by synchronizing to a clock signal, is introduced into transition point detector 3, which is comprised of inverter gate 31 and EX-NOR gate 32. In this detector 3, the leading and trailing edges of the input signal (I) are detected from the output of EX-NOR gate 32, in order to obtain signal S3 shown in FIG. 3, which is synchronous to the detected edges.

Signal S3 is, then, given to F/F circuits 41a and 41b respectively as a clock signal for each circuit. In these F/F circuits, therefore, signals S2a and S2b are sampled and held by synchronizing to the edge, e.g., the trailing edge, of signal S3. As a result, a high level signal S4a is obtained from the output of F/F circuit 41a, and also, a low level signal S4b is obtained from the output of F/F circuit 41b.

These signals S4a and S4b are, then, given to corresponding AND gate 51a or 51b as the selection signal, which is to choose a sampling signal from clock signals A and B. In this case, clock signal A is chosen by AND gate 51a. As a result, the output signal from AND gate 51a is chosen to be the sampling signal, which is delayed against clock signal A by the internal delay time of gate 51a, as shown in FIG. 3. In F/F circuit 6, the input signal (I) is sampled by synchronizing to the sampling signal.

As described above, according to the circuit shown in FIGS. 1 and 2, the transition points of input signal (I) to be sampled are compared with the transition points of clock signals A and B, in order to find a suitable clock signal for sampling. Thus, even in the case where the phase of the input signal to be sampled varies during the operation, a new sampling signal which is suitable for sampling is obtained without delay. Consequently, the timing adjustment between the input signal to be sampled and a clock signal is not required to correctly sample the input signal. Also, an additional structure for the timing adjustment is not required to be attached to the circuits shown in FIGS. 1 and 2. As a result, the circuit can be highly integrated to make its product size smaller.

Next, other embodiments of this invention will be explained with referring to FIGS. 4 and 5.

Figure 4:
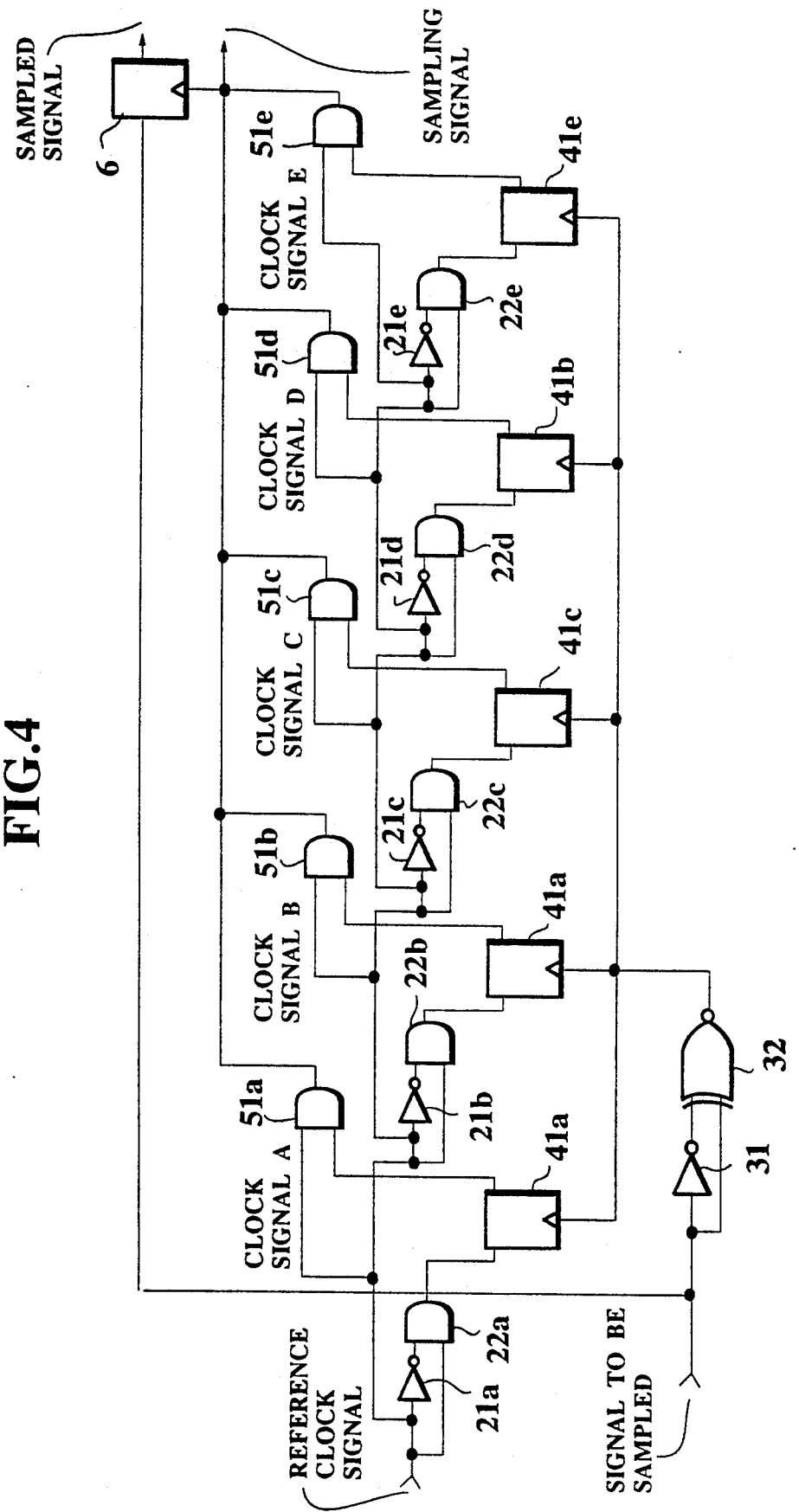
FIG. 4 is a schematic diagram showing the sampling signal generation circuit according to the third embodiment of this invention.

In FIG. 4, a sampling signal generation circuit according to another embodiment of this invention is shown. In this figure, the same numbers as those shown in FIG. 2 indicate the same or the like structure members, so that their explanation will be omitted. Unlike the circuit shown in FIGS. 1 and 2, five clock signals A to E, each of which has a different phase relation, are generated in this circuit using wiring delays instead of the buffer gates shown in FIG. 2. One of the five clock signals is, then, chosen to be a sampling signal. The resolution of the clock signals against the signal to be sampled is, therefore, improved in this embodiment as compared with the circuit shown in FIG. 2. In order to generate the other three clock signals and to select one of them, inverter gates 21c, 21d, and 21e, AND gates 22c, 22d, and 22e, F/F circuits 41c, 41d, and 41e, and AND gates 51c, 51d, and 51e are provided in addition to the circuit shown in FIG. 2. The integration of this circuit also allows to make a small size product.

Figure 5:
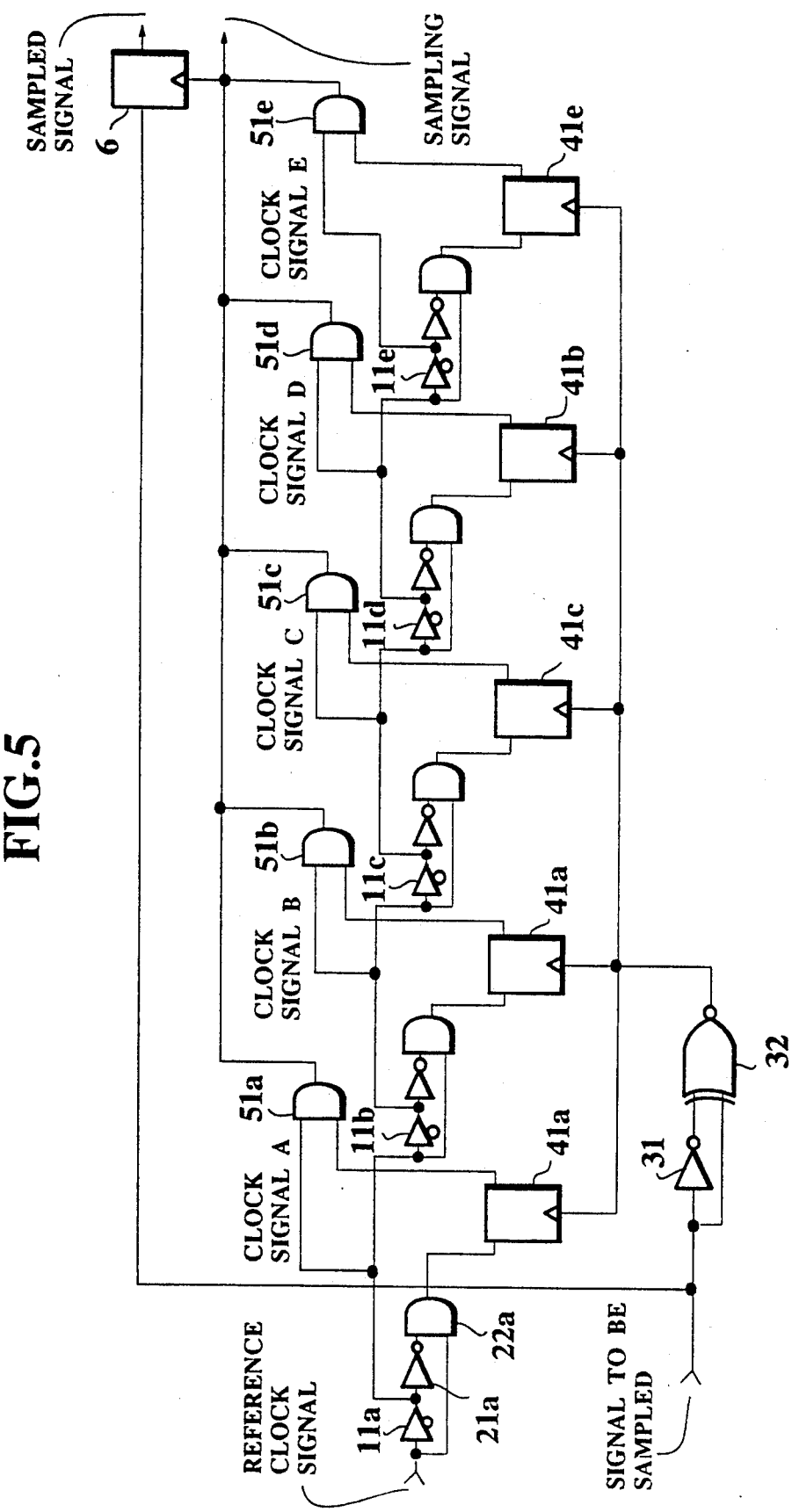
FIG. 5 is a schematic diagram showing the sampling signal generation circuit according to the fourth embodiment of this invention.

In FIG. 5, a sampling signal generation circuit according to the other embodiment of this invention is shown. Unlike the circuit shown in FIG. 4, in the circuit of this embodiment, five clock signals A to E are generated using the internal delays caused in buffer gates 11a, 11b, 11c, 11d, and 11e, in addition to said wiring delays. In this embodiment, of cause, the clock signal resolution against the signal to be sampled, is greatly improved as compared with the circuit shown in FIG. 2.

In summary, according to the circuits of this invention, a best sampling signal can be chosen among a plurality of clock signals by a real time processing. As a result, the timing adjustment, which may be carried out using external devices between a sampling signal and a signal to be sampled, is not required in this circuit. So, a sampling signal generation circuit of a small size, which is able to suppress the generation of wrong operation, is obtained from this invention.

What is claimed is:

1. A sampling signal generation circuit, comprising:
    first means for detecting transition points of a signal to be sampled;
    means to generate a plurality of clock signals, each of which has a different phase relation against a reference clock signal;
    second means for detecting transition points of said clock signals which are generated by said generation means;
    means for comparing said transition points, which are obtained from the signal to be sampled and detected by said first detecting means, with said transition points, which are obtained from a plurality of said clock signals and detected by said second detecting means, and to generate selection signals according to the comparison; and
    means for selecting one of said clock signals to be a sampling signal which is used to carry out a sampling of said signal to be sampled, according to said selection signals produced by said comparing means.

2. The sampling signal generation circuit as claimed in claim 1, wherein a plurality of said clock signals are produced from the reference clock signal using the internal delays of buffer gates.

3. The sampling signal generation circuit as claimed in claim 1, wherein a plurality of said clock signals are produced from the reference clock signal using the line delays of wirings.

4. The sampling signal generation circuit as claimed in claim 1, wherein a plurality of said clock signals are produced from the reference clock signal using the internal delays of buffer gates in addition to the line delays of wirings.

5. A sampling signal generation circuit, comprising:
    a first group of logic gates for detecting transition points of a signal to be sampled;
    a group of buffer gates for producing a plurality of clock signals, each of which has a different phase relation against a reference clock signal;
    a second group of logic gates for detecting transition points of said clock signals which are generated by said buffer gate group;
    flip-flop circuits for comparing said transition points, which are obtained from the signal to be sampled and detected by said first logic gate group, with said transition points, which are obtained from a plurality of said clock signals and detected by said second logic gate group, and for producing selection signals according to the compared result; and
    a third group of logic gates for selecting one of said clock signals produced by said buffer gate group according to said selection signals made by said flip-flop circuits, and for outputting the selected signal to be a sampling signal against the signal to be sampled.

6. The sampling signal generation circuit as claimed in claim 5, wherein said first group of logic gates is comprised of an inverter gate and an EX-NOR gate, and wherein said second group of logic gates is comprised of an inverter gate and an AND gate for each clock signal.

7. The sampling signal generation circuit as claimed in claim 5, wherein said buffer gate group contains five buffer gates in order to generate five kinds of clock signals, each of which has a different phase relation against the reference clock signal.

8. The sampling signal generation circuit as claimed in claim 5, wherein said buffer gate group produces signal delays in co-operation with wiring delays, in order to generate a plurality of said clock signals.

9. A sampling signal generation circuit, comprising:
- a first group of logic gates for detecting transition points of a signal to be sampled;
- a plurality of wiring lines, each of which produces a predetermined amount of signal delay, such that a plurality of clock signals, each of which having a different phase relation against a reference clock signal, are generated by passing a single clock signal through said wiring lines in a parallel manner;
- a second group of logic gates for detecting transition points of said clock signals which are generated by said wiring lines;
- flip-flop circuits for comparing said transition points, which are obtained from the signal to be sampled and detected by said first group of logic gates, with said transition points, which are obtained from a plurality of said clock signals and detected by said second group of logic gates, and for producing selection signals according to the comparison result; and
- a third group of logic gates for selecting one of said clock signals produced by said wiring lines according to said selection signals made by said flip-flop circuits, and for outputting a selected signal to be a sampling signal against the signal to be sampled.

* * * * *